US009023578B2

(12) United States Patent
Katou et al.

(10) Patent No.: US 9,023,578 B2
(45) Date of Patent: May 5, 2015

(54) COPOLYMER FOR LITHOGRAPHY AND METHOD FOR EVALUATING THE SAME

(75) Inventors: Keisuke Katou, Yokohama (JP); Shinichi Maeda, Yokohama (JP); Daisuke Matsumoto, Yokohama (JP)

(73) Assignee: Mitsubishi Rayon Co., Ltd., Tokyo (JP)

(*) Notice: Subject to any disclaimer, the term of this patent is extended or adjusted under 35 U.S.C. 154(b) by 94 days.

(21) Appl. No.: 13/381,249

(22) PCT Filed: Jul. 5, 2010

(86) PCT No.: PCT/JP2010/061382
§ 371 (c)(1),
(2), (4) Date: Dec. 28, 2011

(87) PCT Pub. No.: WO2011/004787
PCT Pub. Date: Jan. 13, 2011

(65) Prior Publication Data
US 2012/0111099 A1 May 10, 2012

(30) Foreign Application Priority Data
Jul. 7, 2009 (JP) ................................. 2009-160857

(51) Int. Cl.
G03F 7/00 (2006.01)
G03F 7/039 (2006.01)

(52) U.S. Cl.
CPC ............ G03F 7/0392 (2013.01); G03F 7/0397 (2013.01)

(58) Field of Classification Search
USPC ............. 430/270.1; 526/319, 320, 328, 329.2
See application file for complete search history.

(56) References Cited

U.S. PATENT DOCUMENTS

| 5,317,069 | A | 5/1994 | Chiang et al. |
| 6,706,826 | B1 | 3/2004 | Fujiwara et al. |
| 8,455,596 | B2 | 6/2013 | Oikawa et al. |
| 2009/0047602 | A1 | 2/2009 | Furuya et al. |
| 2009/0076230 | A1 | 3/2009 | Sheehan et al. |
| 2010/0248164 | A1 | 9/2010 | Kumagai et al. |

FOREIGN PATENT DOCUMENTS

| JP | 10-53620 | 2/1998 |
| JP | 10 274852 | 10/1998 |
| JP | 10 319595 | 12/1998 |
| JP | 2001 201856 | 7/2001 |
| JP | 2002 145955 | 5/2002 |
| JP | 2003-246825 | 9/2003 |
| JP | 2004 269855 | 9/2004 |
| JP | 2005 91407 | 4/2005 |
| JP | 2005 217254 | 8/2005 |
| JP | 2006-36914 | 2/2006 |
| JP | 2007 45922 | 2/2007 |
| JP | 2007-269907 | 10/2007 |
| JP | 2008-045042 | 2/2008 |
| JP | 2008-056810 | 3/2008 |
| JP | 2008 115148 | 5/2008 |
| JP | 2008 239889 | 10/2008 |
| JP | 2008-239889 | * 10/2008 |
| JP | 2009 37184 | 2/2009 |
| JP | 2009 139909 | 6/2009 |
| JP | 2010-513669 | 4/2010 |
| JP | 2010-532807 | 10/2010 |
| JP | 2010-254810 | 11/2010 |
| WO | 99 50322 | 10/1999 |
| WO | 2005 105869 | 10/2005 |

OTHER PUBLICATIONS

International Search Report Issued Oct. 19, 2010 in PCT/JP10/061534 Filed Jul. 7, 2010.
International Search Report Issued Jul. 27, 2010 in PCT/JP10/61382 Filed Jul. 5, 2010.
Office Action issued Jul. 9, 2013 in Japanese Application No. 2009-106618 (With English Translation).
Office Action mailed Jun. 20, 2013 in co-pending U.S. Appl. No. 13/382, 397.
Wen-Yen Chiang, et al., Preparation and Properties of Si-Containing Copolymer for Near-UV Resist. I. Poly (N-(4-Hydroxyphenyl) maleimide-alt-p-Trimethylsilylstyrene), Journal of Polymer Science: Part A: Polymer Chemistry, vol. 29, 1991, pp. 399-410.
Nov. 29, 2013 Office Action of corresponding U.S. Appl. No. 13/967,961, 10 pp.
Office Action mailed Jun. 3, 2014 in co-pending U.S. Appl. No. 13/382,397.
Decision of Rejection issued Jul. 29, 2014 in Japanese patent Application No. 2009-297800 (with English translation).
Murahashi (ed.) et al., "Polymer Chemistry", Chapter3, 3.1, Sep. 2007, 3 pages.
Office Action mailed Nov. 18, 2014, in Japanese Patent Application No. 2009-297800, filed Dec. 28, 2009 (with English-language Translation).
Office Action mailed Jan. 16, 2015 in pending U.S. Appl. No. 13/967,961.
Notice of Allowance mailed Feb. 3, 2015, in Japanese Patent Application No. 2009-297800, filed Dec. 28, 2009 (with English-language Translation).

* cited by examiner

Primary Examiner — Edward Cain
(74) Attorney, Agent, or Firm — Oblon, McClelland, Maier & Neustadt, L.L.P.

(57) ABSTRACT

The present invention provides a method for evaluating lithographic characteristics of a lithographic composition containing a copolymer for lithography without actually preparing the composition. The method comprises the steps of: dissolving the copolymer for lithography in a solvent to prepare a test solution; separating a gel-like substance from the test solution; determining a rate of change of a composition ratio, wherein the rate of change of the composition ratio rate refers to a ratio of a difference obtained by subtracting a composition ratio of constitutional units in the copolymer for lithography from a composition ratio of constitutional units in a gel-like substance to the composition ratio of the constitutional units in the copolymer for lithography.

20 Claims, No Drawings

COPOLYMER FOR LITHOGRAPHY AND METHOD FOR EVALUATING THE SAME

TECHNICAL FIELD

The present invention relates to a copolymer for lithography and a method for evaluating the same.

This application claims priority from Japanese Patent Application No. 2009-160857, filed on Jul. 7, 2009, the entire content of which is hereby incorporated by reference.

BACKGROUND ART

In fabrication of semiconductor elements and liquid crystal elements, techniques of forming a finer pattern by lithography have progressed rapidly in recent years. One of the techniques is, for example, use of use of irradiation light having a shorter wavelength.

More recently, a lithographic technique using a KrF eximer laser (wavelength: 248 nm) has been introduced. For further shortening a wavelength of radiation, lithographic techniques using an ArF eximer laser (wavelength: 193 nm) and EUV eximer laser (wavelength: 13 nm) have been studied.

As a resist composition suitably used for forming a finer pattern and shortening the wavelength of irradiation light, for example, a so-called chemical amplification-type resist composition has been proposed. Such a composition includes a polymer and a photoacid generator. The polymer is alkali-soluble when an acid-removable group is removed by action of an acid. Furthermore, development and improvement of such a resist are ongoing.

An acrylate polymer transparent to 193 nm light has attracted attention as a polymer for a chemically-amplified resist used in ArF eximer laser lithography.

For example, Patent Document 1 describes a resist copolymer that is produced from monomers of: (A) a (meth)acrylic acid ester where an alicyclic hydrocarbon group containing a lactone ring is ester-linked; (B) a (meth)acrylic acid ester where a group capable of leaving with an acid is ester-linked; and (C) a (meth)acrylic acid ester where a hydrocarbon group containing a polar substituent or an oxygen-containing heterocyclic group is ester-linked.

For these resist compositions containing a resist copolymer, an important property is the ability to form a good pattern. Such a resist copolymer is generally evaluated through measurements of development characteristics and the like in a prepared resist composition.

A method described in Patent Documents 2 and 3 comprises dissolving a resin containing a resist copolymer in a resist solvent, measuring a dynamic light scattering of the solution, and using the resultant specific parameter to estimate degrees of generation of development defects, variation of pattern dimensions (LER), and in-liquid generation of a foreign substance in a resist composition prepared with the resin.

CITATION LIST

Patent Documents

[Patent Document 1] JP-A-2002-145955
[Patent Document 2] JP-A-2005-91407
[Patent Document 3] JP-A-2009-37184

SUMMARY OF THE INVENTION

Problems to be Solved by the Invention

The methods described in Patent Documents 2 and 3 can evaluate performances of a resist composition containing a resist copolymer without actually preparing and developing the composition. The method is simple and can eliminate the effects of components other than the copolymer. The method is thus useful for evaluating the actual performance of the copolymer itself.

However, little is still known about the evaluation by this method. Therefore, there is a demand for increasing items that can be evaluated or diversifying the method of evaluation.

In terms of other copolymers for lithography in addition to a resist copolymer, it is similarly important to determine whether a composition for lithography containing the copolymer for lithography has highly accurate microfabrication performance (lithographic characteristics) or not. Examples of copolymers for lithography other than the resist copolymer include copolymers for thin film formation in a lithography process. Examples of the thin film include an anti-reflection film, gap-fill film and topcoat film. There is also a demand for evaluating properties of the lithographic composition containing the copolymer for lithography without actually preparing the composition and subjecting it to a lithography process.

The present invention has been made in consideration of the aforementioned problem. The object of the present invention is to provide a method for evaluating lithographic characteristics of a lithographic composition containing a copolymer for lithography without actually preparing the composition.

Solutions to the Problems

To solve the problems described above, a first aspect of the present invention is as follows:

(1) A method for evaluating a copolymer for lithography, comprising the steps of:
   (i) dissolving the copolymer for lithography in a solvent to prepare a test solution;
   (ii) separating a gel-like substance from the test solution;
   (iii) determining a rate of change of a composition ratio, wherein the rate of change of the composition ratio refers to a ratio of a difference obtained by subtracting a composition ratio of constitutional units in the copolymer for lithography from a composition ratio of constitutional units in a gel-like substance to the composition ratio of the constitutional units in the copolymer for lithography; and
   (iv) evaluating lithographic characteristics of a lithographic composition containing the copolymer for lithography based on the rate of change of the composition ratio (2) the method for evaluating a copolymer for lithography according to (1), wherein the copolymer for lithography is a resist copolymer and comprises at least one constitutional unit having an acid-removable group and at least one constitutional unit having a polar group; and
   wherein development characteristics of the resist composition containing the resist copolymer are evaluated based on the change ratio of the composition ratio;

(3) the method for evaluating a copolymer for lithography according to (1) or (2), wherein the step of preparing a test solution comprises adding a poor solvent to generate a gel-like substance; and (4) the method for evaluating a copolymer for lithography according to any one of (1) to (3), wherein the gel-like substance is separated by centrifugation.

A second aspect of the present invention is as follows:

(5) A copolymer for lithography having a rate of change of a composition ratio of not more than 8%, wherein the rate of change of the composition ratio is measured by processing the copolymer according to the following steps of:

(v) dissolving the copolymer in propylene glycol monomethyl ether acetate such that a concentration of the copolymer is 2.5% by mass to prepare a test solution;

(vi) adding a poor solvent to the test solution until a transmittance at 450 nm comes in the range of 85±3%;

(vii) separating a gel-like substance from the test solution by centrifugation under conditions of a relative centrifugal force of 500,000 G, a processing temperature of 4° C., and a processing time of 4 hours; and (viii) determining the rate of change of the composition ratio by a nuclear magnetic resonance spectrometer (NMR), wherein the rate of change of the composition ratio refers to a ratio of a difference obtained by subtracting a composition ratio of at least one of constitutional units of the copolymer for lithography from a composition ratio of at least one of constitutional units of the gel-like substance to the composition ratio of the structural units in the copolymer for lithography.

(6) A lithographic composition comprising the copolymer for lithography according to (5).

Effects of the Invention

According to the method of the present invention, lithographic characteristics of a lithographic composition containing a copolymer for lithography can be evaluated without actually preparing the composition.

DESCRIPTION OF EMBODIMENTS

As used herein, "(meth)acrylic acid" refers to acrylic acid or methacrylic acid, and "(meth)acryloyloxy" refers to acryloyloxy or methacryloyloxy.

<Copolymer for Lithography>

The copolymer for lithography evaluated according to the present invention is produced from two or more monomers and is used in a lithography process. The copolymer can be of any kind if it can form a gel-like substance in a solution as described below.

Examples of the copolymer include copolymers for a resist used in forming a resist film, copolymers for an anti-reflection film in forming a top anti-reflection film (TARC) on a resist film or a bottom anti reflection film (BARC) under a resist film, copolymers for a gap-fill film used in forming a gap-fill film, and copolymers for a topcoat film used in forming a topcoat film.

Examples of the resist copolymer include copolymers each including at least one constitutional unit having an acid-removable group and at least one constitutional unit having a polar group.

Examples of the copolymer for an anti-reflection film include copolymers each including a constitutional unit having a light-absorbing group and a constitutional unit having a reactive functional group that enables curing through a reaction with a curing agent or the like in order to prevent interfusion with a resist film. Examples of the reactive functional group include an amino group, an amide group, a hydroxyl group, and an epoxy group.

The light-absorbing group refers to a group having high absorbability of light having a wavelength within the specific range of wavelength that light can expose a photosensitive component in a resist composition. Specific examples of the light-absorbing group include groups having a ring structure such as an anthracene ring, a naphthalene ring, a benzene ring, a quinoline ring, a quinoxaline ring, and a thiazole ring, which may be substituted with any substituent. Particularly when a KrF laser beam is irradiated, the light-absorbing group is preferably an anthracene ring or a substituted anthracene ring with any substituent. When an ArF laser beam is irradiated, the light-absorbing group is preferably a benzene ring or a substituted benzene ring with any substituent.

Examples of the substituent include a phenolic hydroxyl group, an alcoholic hydroxyl group, a carboxy group, a carbonyl group, an ester group, an amino group, and an amide group.

Among those described above, for achieving good developability and high resolution, preferred are copolymers for an anti-reflection film having a light-absorbing group bearing a protected or unprotected phenolic hydroxyl group.

Examples of the constitutional unit/monomer having the light-absorbing group as described above include benzyl (meth)acrylate and p-hydroxyphenyl(meth)acrylate.

The copolymer for a gap-fill film is, for example, a copolymer having an appropriate viscosity for flowing into a narrow gap and comprising a constitutional unit having a reactive functional group that enables curing through a reaction with a curing agent or the like in order to prevent interfusion with a resist film or an anti-reflection film. Specific examples of the copolymer include copolymers of hydroxystyrene with monomers such as styrene, alkyl (meth)acrylate, and hydroxyalkyl (meth)acrylate.

Examples of the copolymer for a topcoat film used in immersion lithography include copolymers each having a constitutional unit with a carboxyl group and copolymers each having a constitutional unit with a fluorine-containing group substituted with a hydroxyl group.

Such a copolymer for lithography is difficult to produce as designed molecularly by copolymerization. Copolymerization inevitably causes variations in molecular weight and monomer composition ratio. In addition, copolymers produced based on the same molecular design but through different methods have different degrees of variations in molecular weight and monomer composition ratio. Only differences in production thus can cause differences in the performances of copolymers in a lithography process. According to the method of evaluation of the present invention, differences in performances caused by differences in production can be evaluated. The copolymer for lithography is thus suitable to be evaluated in the present invention.

<Resist Copolymer>

Below, the present invention will be described with reference to a resist copolymer (hereinafter, also referred to as simply copolymer) as a typical copolymer for lithography. However, the present invention can be applied to other copolymers for lithography as well as the copolymer for lithography.

The present invention can be applied to any resist copolymer if the copolymer is used for forming a resist film, is produced from two or more monomers, and can produce a gel-like substance in a solution as described below.

In a copolymer having a constitutional unit having a polar group, a rate of change of a composition ratio described below particularly tends to increase. The copolymer is thus suitably evaluated by the method of evaluating with a rate of change of a composition ratio according to the present invention. The copolymer can also be evaluated by the method of evaluating with a rate of molecular weight change according to the present invention described below.

The copolymer is more specifically a resist copolymer comprising at least one constitutional unit having an acid-removable group and at least one constitutional unit having a polar group. This copolymer can be produced by polymerization of a mixture of at least one monomer having an acid-removable group and at least one monomer having a polar group.
[Constitutional Unit/Monomer Having Acid-Removable Group]

The "acid-removable group" refers to a group having a bond that is cleaved with an acid. A part or the entire acid-removable group leaves from the backbone of the copolymer.

A copolymer having a constitutional unit having the acid-removable group, when used as a resist composition, develops alkali solubility with an acid to exert the effect of enabling the formation of a resist pattern.

From the viewpoint of sensitivity and resolution, a content of the constitutional unit having the acid-removable group is preferably not less than 20 mol %, and more preferably not less than 25 mol %. From the viewpoint of adhesion to a substrate or the like, the content is also preferably not more than 60 mol %, more preferably not more than 55 mol %, and even more preferably not more than 50 mol %.

Any known compound having an acid-removable group and a polymerizable multiple-bond can be used as the monomer having an acid-removable group. The term "polymerizable multiple-bond" refers to a multiple-bond that is cleaved in polymerization to form a copolymer chain. The multiple-bond is preferably an ethylenic double bond.

Specific examples of the monomer having an acid-removable group include (meth)acrylic acid esters having an alicyclic hydrocarbon group having 6 to 20 carbon atoms and an acid-removable group. The alicyclic hydrocarbon group may be attached to an oxygen atom of the ester bond of the (meth) acrylic acid ester directly or via a connecting group such as an alkylene group.

Examples of the (meth)acrylic acid ester include (meth) acrylic acid esters having an alicyclic hydrocarbon group having 6 to 20 carbon atoms and a tertiary carbon atom to which an oxygen atom of the ester bond of the (meth)acrylic acid ester is attached directly and (meth)acrylic acid esters having an alicyclic hydrocarbon group having 6 to 20 carbon atoms attached to a —COOR group (wherein R represents an optionally substituted tertiary hydrocarbon, tetrahydrofuranyl, tetrahydropyranyl, or oxepanyl group) directly or via a connecting group such as an alkylene group.

Particularly, for producing a resist composition used in a method of forming a pattern by exposing with light having a wavelength of not more than 250 nm, preferred examples of the monomer having an acid-removable group include 2-methyl-2-adamantyl(meth)acrylate, 2-ethyl-2-adamantyl(meth)acrylate, 1-(1'-adamantyl)-1-methylethyl(meth)acrylate, 1-methylcyclohexyl(meth)acrylate, 1-ethylcyclohexyl(meth)acrylate, 1-methylcyclopentyl(meth)acrylate, and 1-ethylcyclopentyl(meth)acrylate.

These monomers may be used alone or in combination.
[Constitutional Unit/Monomer Having Polar Group]

The "polar group" refers to a group having a polar functional group or a polar atomic group. Specific examples of the polar group include a hydroxy group, a cyano group, an alkoxy group, a carboxy group, an amino group, a carbonyl group, a group having a fluorine atom, a group having a sulfur atom, a group having a lactone skeleton, a group having an acetal structure, and a group having an ether bond.

Among those described above, preferred for the constitutional unit having a polar group of a resist copolymer used in a method of forming a pattern by exposing with light having a wavelength of not more than 250 nm is a constitutional unit having a lactone skeleton. The resist copolymer preferably further has a constitutional unit having a hydrophilic group as described below.

(Constitutional Unit/Monomer Having Lactone Skeleton)

Examples of the lactone skeleton include those having 4 to 20 members. The lactone skeleton may be of a monocyclic system having only a lactone ring, or may be of a condensed-ring system of a lactone ring with an aliphatic or aromatic carbo- or heterocyclic.

When the copolymer comprises a constitutional unit having a lactone skeleton, from the viewpoint of adhesion to a substrate or the like, a content of the constitutional unit is preferably not less than 20 mol %, and more preferably not less than 35 mol % of all constitutional units (100 mol %). From the viewpoints of sensitivity and resolution, the content is also preferably not more than 60 mol %, more preferably not more than 55 mol %, and even more preferably not more than 50 mol %.

From the viewpoint of good adhesion to a substrate or the like, the monomer having a lactone skeleton is preferably at least one monomer selected from (meth)acrylic acid esters having a substituted or unsubstituted δ-valerolactone ring and monomers having a substituted or unsubstituted δ-valerolactone ring, and particularly preferably a monomer having an unsubstituted γ-butyrolactone ring.

Specific examples of the monomer having a lactone skeleton include β-(meth)acryloyloxy-β-methyl-δ-valerolactone, 4,4-dimethyl-2-methylene-γ-butyrolactone, β-(meth)acryloyloxy-γ-butyrolactone, β-(meth)acryloyloxy-β-methyl-γ-butyrolactone, α-(meth)acryloyloxy-γ-butyrolactone, 2-(1-(meth)acryloyloxy)ethyl-4-butanolide, pantoyl lactone (meth)acrylate, 5-(meth)acryloyloxy-2,6-norbornanecarbolactone, 8-methacryloxy-4-oxatricyclo[5.2.1.0$^{2,6}$]decan-3-one, and 9-methacryloxy-4-oxatricyclo[5.2.1.0$^{2,6}$]decan-3-on. Examples also include monomers having an analogous structure such as methacryloyloxy succinic anhydrous.

These monomers may be used alone or in combination.
(Constitutional Unit/Monomer Having a Hydrophilic Group)

As used herein, the "hydrophilic group" refers to at least one group from —C(CF$_3$)$_2$—OH, a hydroxy group, a cyano group, a methoxy group, a carboxy group, and an amino group.

Among these groups, preferred for the hydrophilic group of a resist copolymer used in a method of forming a pattern by exposing with light having a wavelength of not more than 250 nm are a hydroxy group and a cyano group.

From the viewpoint of rectangularity of a resist pattern, a content of the constitutional unit having a hydrophilic group in the copolymer is preferably 5 to 30 mol %, and more preferably 10 to 25 mol % of all constitutional units (100 mol %).

Examples of the monomer having a hydrophilic group include (meth)acrylic acid esters having a terminal hydroxy group, derivatives from a monomer having a hydrophilic group by introducing a substituent such as an alkyl group, a hydroxy group, and a carboxy group on the hydrophilic group, and monomers having a cyclic hydrocarbon group substituted with a hydrophilic group such as a hydroxy group and carboxy group, including cyclohexyl(meth)acrylate, 1-isonorbornyl(meth)acrylate, adamantyl(meth)acrylate, tricyclodecanyl(meth)acrylate, dicyclopentyl(meth)acrylate, 2-methyl-2-adamantyl(meth)acrylate, and 2-ethyl-2-adamantyl(meth)acrylate.

Specific examples of the monomer having a hydrophilic group include (meth)acrylic acid, 2-hydroxyethyl(meth)acrylate, 3-hydroxypropyl(meth)acrylate, 2-hydroxy-n-propyl (meth)acrylate, 4-hydroxybutyl(meth)acrylate, 3-hydroxyadamantyl(meth)acrylate, 2- or 3-cyano-5-norbornyl (meth)acrylate, and 2-cyanomethyl-2-adamantyl(meth)

acrylate. From the viewpoint of adhesion to a substrate or the like, preferred are 3-hydroxyadamantyl(meth)acrylate, 2- or 3-cyano-5-norbornyl(meth)acrylate, and 2-cyanomethyl-2-adamantyl(meth)acrylate.

These monomers may be used alone or in combination.

<Method for Producing Copolymer for Lithography>

Hereinafter, the present invention will be described with reference to a method for producing a resist copolymer as a typical method for producing a copolymer for lithography. However, the present invention can be applied to methods for producing other copolymers for lithography as well as for the resist copolymer.

A resist copolymer can be produced by radical polymerization. Any known method for polymerization can be appropriately employed, including mass polymerization, solution polymerization, suspension polymerization, and emulsion polymerization.

Particularly, for preventing reduction of light transmission, preferred is solution radical polymerization, because remaining monomers after the polymerization can be easily removed and the polymerization can produce a relatively low molecular weight polymer. Solution radical polymerization is more preferably performed by a method of drop polymerization, because the method causes small variations in average molecular weight and population of molecular weight and the like among production lots and can produce a reproducible polymer conveniently.

In the method of drop polymerization, into a polymerization vessel the inside of which is heated to a predetermined polymerization temperature, monomers and a polymerization initiator are added dropwise separately or in any combination. A monomer may be added alone, or in a form of solution in a solvent. A solvent may be placed beforehand in the polymerization vessel or not. When a solvent is not placed beforehand in the polymerization vessel, a monomer or the polymerization initiator is added dropwise to the polymerization vessel containing no solvent.

The polymerization initiator may be directly mixed with a monomer, dissolved in a solution of the monomer, or dissolved in a solvent alone. A monomer and the polymerization initiator may be mixed in a preparation tank and added dropwise to the polymerization vessel as a mixture, or may be added dropwise separately from respective preparation tanks. It is also possible to mix the monomer and the polymerization initiator immediately before dropping into the reaction vessel during feeding from respective preparation tanks to the reaction vessel. One of the monomer and the polymerization initiator may be added dropwise, and then the other may be added dropwise. Alternatively, both of the monomer and the polymerization initiator may be added dropwise simultaneously.

A rate of dropping may be constant until the dropping is completed, or may be varied in several levels according to a consumption rate of the monomer or the polymerization initiator. The dropping may be continuous or intermittent.

In cases of the method of drop polymerization for solution radical polymerization, generation of a high-molecular-weight product can be controlled by increasing a feed rate of the polymerization initiator and/or a monomer at the early stage of polymerization.

In general, the method of drop polymerization tends to generate a high-molecular-weight product at the early stage of polymerization when dropping monomers and a polymerization initiator for the same dropping time at a constant rate. An increased feed rate of the polymerization initiator at the early stage of polymerization facilitates decomposition of the polymerization initiator, resulting in stationary generation and deactivation of a radical. The radical can prevent monomers dropped therein from forming a high-molecular-weight product at the early stage of polymerization.

A specific example of a method for controlling generation of a high-molecular-weight product comprises varying respective feed rates of two or more dropping liquids prepared to several levels separately. Another example of the method comprises placing a part or all of a solvent and a polymerization initiator in a polymerization vessel and dropping a dropping liquid comprising monomers and/or the rest of the polymerization initiator and the like.

In the method of drop polymerization that drops two or more monomers having different reactivities and a polymerization initiator for the same dropping time at a constant rate, the monomer having the higher reactivity generally polymerizes the earlier. As a result, a high-molecular-weight product generated at the early stage of polymerization tends to contain a large amount of a copolymer having a heterogeneous composition.

There are methods for controlling generation of a high-molecular-weight product having a heterogeneous composition at the early stage of polymerization. One of the methods comprises placing monomers to be polymerized in a reactor according to a reactivity ratio of the monomers, and polymerizing the monomers in the steady state from the start of the polymerization to produce a polymer having a homogeneous composition.

Further, in order to produce a copolymer having a more homogeneous molecular weight and composition, the method for controlling generation of a high-molecular-weight product at the early stage of polymerization and the method for controlling generation of a high-molecular-weight product having a heterogeneous composition at the early stage of polymerization are preferably combined.

According to the method of production, a produced copolymer tends to have small variations in the composition ratio of constitutional units. Small variations in the composition ratio of constitutional units result in a copolymer having good solubility in a solvent and an ability to construct a resist composition having high sensitivity.

Hereinafter, an embodiment of the method of production will be described.

In the advantageous embodiment, the method of production of a polymer comprises a step of polymerizing two or more monomers $\alpha_1$ to $\alpha_n$ in a reactor with dropping monomers and a polymerization into the reactor to give a polymer (P) composed of constitutional units $\alpha'_1$ to $\alpha'_n$.

The step of polymerizing is performed by radical polymerization. In the method of drop polymerization employed in the method of production, monomers and the polymerization initiator are added dropwise to the reactor and polymerized therein.

In this case, a first solution containing monomers $\alpha_1$ to $\alpha_n$ in a first composition and a second solution containing monomers $\alpha_1$ to $\alpha_n$ in a second composition are used as monomer liquids. The first solution and the second solution each preferably contain a solvent.

[Second Solution]

The content ratio of monomers in the second solution (second composition ratio) is equal to a desired composition. The desired composition refers to a content ratio of constitutional units $\alpha'_1$ to $\alpha'_n$ in a polymer (P) to be produced.

For example, when the polymer (P) is a three-component copolymer produced from monomers x, y, and z and has a desired composition of x':y':z' (in mol %, the same applies to hereinbelow), x:y:z in the second composition (in mol %, the same applies to hereinbelow) is equal to x':y':z'.

The second solution is fed dropwise to the reactor.

[First Solution]

A content ratio of monomers in the first solution (first composition ratio) is pre-determined by emphasizing the contribution of respective reactivities of monomers used in polymerization to a desired composition ratio in the polymer (P).

More particularly, the first composition ratio is designed such that when the second solution is added dropwise to a reactor containing monomers at a content ratio equal to the first composition ratio, a polymer molecule generated immediately after dropping has a content ratio of constitutional units equal to a target composition ratio. In this case, a content ratio of constitutional units in the polymer molecule is equal to that of monomers in the second solution dropped (target composition ratio), and hence a content ratio of remaining monomers in the reactor immediately after dropping is constant (first composition ratio). Continuous dropping of the second solution into the reactor accordingly provides a steady state of continuous generation of a polymer molecule having a target composition ratio. The method of designing the first composition ratio will be described below.

The first solution may be placed in a reactor beforehand, or gradually fed dropwise to a reactor or the like, or used in a combined way thereof.

[Polymerization Initiator]

The polymerization initiator is fed dropwise to a reactor. The polymerization initiator may be contained in the second solution, or in cases of dropping the first solution, may in the first solution. A solution containing the polymerization initiator (polymerization initiator solution) may also be added dropwise separately from the first or second solution. The polymerization initiator may be added dropwise in a combined way thereof.

An amount of the polymerization initiator used (total feed amount) is determined according to the type of the polymerization initiator. The total feed amount also depends on a target weight average molecular weight of a polymer (P) to be produced.

For example, when the polymer (P) is a polymer for lithography, an amount of the polymerization initiator used (total feed amount) is preferably within the range of 1 to 25 mol %, and more preferably within the range of 1.5 to 20 mol % to 100 mol % of the total amount of monomers fed to a reactor (total feed amount).

[Content of Monomer]

The total amount of monomers used in polymerization (total feed amount of monomers) refers to a sum of all monomers in the first solution and in the second solution. The total feed amount of monomers is determined according to an amount of polymer (P) to be produced.

When the total amount of monomers in the first solution accounts for only a small part of the total feed amount of monomers, desired effects of use of the first solution are insufficiently achieved. When the total amount accounts for an excessively large part, a polymer produced at the early stage of polymerization has an excessively high-molecular-weight weight. The total amount of monomers in the first solution thus preferably accounts for 3 to 40% by mass, and more preferably 5 to 30% by mass of the total feed amount of monomers.

[Step of Polymerization]

The step of polymerization requires the presence of the first solution in a reactor when dropping a polymerization initiator into the reactor. The first solution thus starts to be fed to the reactor before dropping the polymerization initiator or simultaneously with the start of the dropping.

The step of polymerization also requires the presence of the first solution and the polymerization initiator in a reactor when dropping the second solution into the reactor. The second solution thus starts to be added dropwise to the reactor after or simultaneously with the start of feed of the first solution. The dropwise addition of the second solution also starts after or simultaneously with the start of dropping of the polymerization initiator. The dropwise addition of the second solution preferably starts at the same time of the start of dropping of the polymerization initiator.

The second solution may be added dropwise continuously or intermittently. The second solution may also be added dropwise at a varying rate. In order to produce a polymer having more constant composition ratio and molecular weight, the second solution is preferably added dropwise continuously at a steady rate.

In cases of feeding the first solution dropwise, the first solution may be added dropwise continuously or intermittently. The first solution may also be added dropwise at a varying rate. In order to produce a polymer having more constant composition ratio and molecular weight, the first solution is preferably added dropwise continuously at a steady rate.

The first solution is preferably fed entirely at the early stage of the step of polymerization. More particularly, the feeding of the first solution is completed within 20% of a general period from the start of the dropwise addition of the polymerization initiator to the end of the dropwise addition of the second solution. For example, when the general period is four hours, the first solution is fed entirely into the reactor within 48 minutes from the start of the dropwise addition of the polymerization initiator.

The feed of the first solution is preferably completed within 15%, and more preferably 10% of the general period.

The first solution may be fed entirely at the point of 0% of the general period. In other words, the entire first solution may be placed in the reactor before the start of the dropwise addition of the polymerization initiator.

A feed rate of the polymerization initiator is increased at the early stage of the step of polymerization. More specifically, a fast feed period of the polymerization initiator is defined as a period from 0% to j % (j is equal to 5 to 20) of the general period. During the fast feed period, the polymerization initiator is added dropwise at a faster rate than an average feed rate Vj that is defined by dividing the total feed amount of the polymerization initiator by the general period.

The fast feed period of the polymerization initiator starts at the same time of the start of the general period, or at 0% of the general period. The fast feed period ends at j % of the general period. The j % is within the range of 5 to 20%, preferably 5.5 to 17.5%, and more preferably 6 to 15%.

An amount of the polymerization initiator fed to the reactor within the fast feed period is 30 to 90% by mass of the total feed amount of the polymerization initiator. The amount of the polymerization initiator fed within the fast feed period influences a weight average molecular weight of a polymer produced at the early stage of the step of polymerization. An optimum amount of the polymerization initiator fed within the fast feed period thus varies according to the type of monomers, a feed rate of monomers, the type of the polymerization initiator, conditions of polymerization, and the like. The amount fed within the fast feed period is preferably determined such that a polymer produced particularly at the early stage of the step of polymerization has a weight average molecular weight close to a target value. For example, the amount fed within the fast feed period is preferably 35 to 85% by mass, and more preferably 40 to 80% by mass of the total feed amount of the polymerization initiator.

A dropping rate of the polymerization initiator during the fast feed period must be kept higher than the average feed rate. During the fast feed period, the dropping rate may be varied.

A dropping rate of the polymerization initiator after the fast feed period must be lower than the average feed rate. After the fast feed period, the dropping rate may be varied during the polymerization initiator is fed. The polymerization initiator may be added dropwise continuously or intermittently.

The dropwise addition of the polymerization initiator is preferably completed after or simultaneously with the end of the feed of the first solution.

The dropwise addition of the polymerization initiator is preferably completed at the same time of the end of the dropwise addition of the second solution, but there may be a certain amount of flexibility.

Preferred embodiments of the step of polymerization include the following (a) and (b).

(a) In a reactor, a first solution containing monomers $\alpha_1$ to $\alpha_n$ in a first composition ratio is placed. The inside of the reactor is heated to a predetermined polymerization temperature. A polymerization initiator solution containing a part of a polymerization initiator is added dropwise to the reactor together with the dropwise addition of a second solution containing monomers $\alpha_1$ to $\alpha_n$ in a second composition ratio and the rest of the polymerization initiator. The dropwise addition of the polymerization initiator solution starts at the same time or before the start of the dropwise addition of the second solution, and preferably at the same time. A period from the start of the dropwise addition of the polymerization initiator solution to the start of the dropwise addition of the second solution is preferably 0 to 10 minutes.

Respective dropping rates are preferably constant. The dropwise addition of the polymerization initiator solution is completed before the dropwise addition of the second solution is completed.

In this embodiment, a general period starts at the point of starting to drop the polymerization initiator solution, or the dropwise addition of the polymerization initiator starts at the point. In this embodiment, before the start of the dropwise addition of the polymerization initiator, the entire first solution is fed to the reactor. In other words, the feed of the first solution has been completed at 0% of the general period. A fast feed period corresponds to a period of dropping the polymerization initiator solution. An amount of the polymerization initiator fed during the fast feed period is a sum of an amount of the polymerization initiator in the polymerization initiator solution and an amount of the polymerization initiator in the second solution added dropwise during the polymerization initiator solution is added dropwise. The dropwise addition of the polymerization initiator is completed at the end of the dropwise addition of the second solution.

(b) In a reactor, only a solvent is placed. The inside of the reactor is heated to a predetermined polymerization temperature. Into the reactor, a first solution containing monomers $\alpha_1$ to $\alpha_n$ in a first composition ratio is added dropwise together with the dropwise addition of a part of a polymerization initiator and a second solution containing monomers $\alpha_1$ to $\alpha_n$ in a second composition ratio and the rest of the polymerization initiator. The dropwise addition of the first solution starts at the same time or before the start of the dropwise addition of the second solution. A period from the start of the dropwise addition of the first solution to the start of the dropwise addition of the second solution is preferably 0 to 10 minutes.

Respective dropping rates of solutions are preferably constant. The dropwise addition of the first solution is completed before the dropwise addition of the second solution is completed.

In this embodiment, the dropwise addition of the polymerization initiator starts at the point of starting to drop the first solution. A fast feed period corresponds to a period of dropping the first solution. An amount of the polymerization initiator fed to the reactor during the fast feed period is a sum of an amount of the polymerization initiator in the first solution and an amount of the polymerization initiator in the second solution added dropwise during the first solution is added dropwise. The dropwise addition of the polymerization initiator is completed at the end of the dropwise addition of the second solution.

According to the method of these embodiments, use of the first and the second solutions having designed content ratio of monomers so as to provide the steady state enables to constantly generate a polymer molecule having a composition nearly equal to a target composition ratio.

The polymer (P) produced by the step of polymerization thus has small variations in content ratio of constitutional units, thereby having an increased solubility in a solvent for polymer. Further, a resist composition comprising the polymer has an increased sensitivity.

As well as the use of separated solutions, the addition of the first solution containing monomers at the early stage of the step of polymerization separating from the second solution containing monomers and the presence of the fast feed period of the polymerization initiator at the early stage also decrease a variation in weight average molecular weight according to a reaction time in the step of polymerization as described in Examples below. The polymer produced thus has an increased solubility in a solvent, and a resist composition comprising the polymer has an increased sensitivity. The reason may be that generation of a polymer molecule having much high weight average molecular weight is prevented.

As described above, according to these embodiments, the polymer (P) having good solubility in a solvent and ability of constructing a resist composition having high sensitivity can be produced with good reproducibility.

The polymer can be suitable for other applications than a resist. Use of the polymer can provide effects of increasing solubility and is expected to improve various properties.

<Method of Designing First Composition Ratio>

Below, a method of designing a first composition ratio is described.

To produce a polymer (P) having a content ratio of constitutional units (a target composition ratio) represented by $\alpha'_1:\alpha'_2:\ldots:\alpha'_n$ (in mol %), a first composition ratio represented by $\alpha_1:\alpha_2:\ldots:\alpha_n$ (in mol %) has relations with the target composition ratio as represented by $\alpha_1=\alpha'_1/F_1$, $\alpha_2=\alpha'_2/F_2$, ... and $\alpha_n=\alpha'_n/F_n$, wherein $F_1$, $F_2$, ... and $F_n$ each represent a factor determined according to the following procedures (1) to (3):

(1) firstly dropping a dropping solution comprising 100 parts by mass of a mixture of monomers of a composition equal to the target composition ratio $\alpha'_1:\alpha'_2:\ldots:\alpha'_n$, a polymerization initiator, and a solvent to a reactor containing only a solvent at a constant rate, and then determining a composition ratio $M_1:M_2:\ldots:M_n$ (in mol %) of monomers $\alpha_1$ to $\alpha_n$ remaining in the reactor at each point of $t_1, t_2, t_3 \ldots$ and $t_m$ from the start of dropping and a composition $P_1:P_2:\ldots:P_n$ (in mol %) of constitutional units $\alpha'_1$ to $\alpha'_n$ in a polymer generated during each period of time from $t_1$ to $t_2$, from $t_2$ to $t_3, \ldots$ and from $t_m$ to $t_{m+1}$;

(2) finding a period of time from $t_m$ to $t_{m+1}$ (m is the integer not less than 1) at which the polymer has the closest $P_1:P_2:\ldots:P_n$ to the target composition ratio $\alpha'_1:\alpha'_2:\ldots:\alpha'_n$;

(3) determining factors $F_1$, $F_2$, ... and $F_n$ according to relations $F_1=P_1/M_1$, $F_2=P_2/M_2$, ... and $F_n=P_n/M_n$ from values of $P_1:P_2:\ldots:P_n$ during the period of time from $t_m$ to $t_{m+1}$ and values of $M_1:M_2:\ldots:M_n$ at the point of $t_m$.

More particularly, when the polymer (P) is a three-component copolymer produced from monomers x, y, and z and a target composition ratio is x':y':z', a first composition ratio $x_0:y_0:z_0$ (in mol %, the same applies hereinbelow) is calculated according to relations $x_0=x'/Fx$, $y_0=y'/Fy$, and $z_0=z'/Fz$, wherein Fx, Fy, and Fz each represents a factor determined according to the following method.

[Method for Determining Factors Fx, Fy, and Fz]

Hereinafter, the method for determining factors will be described with reference to the case that the polymer (P) is a three-component polymer. The method is also applicable to two-component and four- or more multi-component polymers. The method comprises:

(1) firstly dropping a dropping solution comprising a mixture of monomers of a composition ratio equal to the target composition x':y':z', a solvent, and a polymerization initiator to a reactor containing only a solvent at a constant dropping rate v; and then determining a composition ratio Mx:My:Mz (in mol %) of monomers x, y, and z remaining in the reactor at each point of $t_1$, $t_2$, $t_3$ ... and $t_m$ from the start of dropping and a composition ratio $P_1:P_2:\ldots:P_n$ (in mol %) of constitutional units in a polymer generated during each period of time from $t_1$ to $t_2$, from $t_2$ to $t_3$, ... and from $t_m$ to $t_{m+1}$;

(2) finding a period of time from $t_m$ to $t_{m+1}$ (m is the integer not less than 1) at which the polymer has the closest Px:Py:Pz to the target composition ratio x':y':z';

(3) determining factors Fx, Fy, and Fz according to relations Fx=Px/Mx, Fy=Py/My, and Fz=Pz/Mz from values of Px:Py:Pz during the period of time from $t_m$ to $t_{m+1}$ and values of Mx:My:Mz at the point of $t_m$.

Factors Fx, Fy, and Fz reflect relative reactivities of respective monomers. These factors will vary as a combination of monomers used in polymerization or a target composition ratio changes.

(4) preferably determining a percentage of the total mass of monomers remaining in the reactor at the point of $t_m$ ($W_0$ % by mass) to 100% by mass of the mixture of monomers in the initial dropping solution.

In the method of production of the above-described embodiment, use of the first solution in an amount such that the total amount of monomers in the first solution accounts for $W_0$ % by mass of the whole monomers fed allows effects of generating a polymer molecule having a composition ratio nearly equal to the target composition ratio to be easily achieved immediately after the start of polymerization.

<Method for Evaluation>
<Step (i)>

In the method for evaluation of the present invention, a resist copolymer is first dissolved in a solvent to prepare a test solution. In the present invention, the "test solution" refers to a liquid to be subjected to an operation of separation in the next step. In the test solution, a part of the copolymer must be undissolved, and a high-molecular-weight component having low solubility must form a gel-like substance. The gel-like substance is thus formed according to need. In other words, if a resist copolymer is completely dissolved, a gel-like substance is formed by a means described below or the like to prepare a test solution.

An amount of the gel-like substance in the test solution is only required to be sufficient for measuring a polymerization average molecular weight or a composition ratio of a constitutional unit after the operation of separation in the next step. To evaluate more accurately, the smaller amount of the gel-like substance is the better.

The amount of the gel-like substance in the test solution can be adjusted by measuring a transmittance of the test solution with a UV-visible spectrophotometer. At a wavelength used for measuring the transmittance, a resist film formed with the resist copolymer to be measured is opaque. For example, when the resist copolymer is an acrylate polymer, a wavelength for measurement is preferably within the range of visible light, in particular from 380 to 780 nm, and more preferably 450 nm. The test solution containing the larger amount of gel-like substance has the lower transmittance.

More particularly, the transmittance of the test solution is preferably 75 to 90(%), and more preferably 82 to 88(%).

In comparative evaluation of several copolymers for a resist according to the method of evaluation of the present invention, respective test solutions are preferably adjusted to contain the same amount of gel-like substance as each other. A variation of transmittance among test solutions for comparative evaluation (absolute value of a difference between the maximum value (%) and the minimum value (%)) is preferably within 6%.

A test solution is preferably prepared by the following method. First, a resist copolymer is completely dissolved in a good solvent. To the solution is added a poor solvent under monitored conditions for a transmittance with a UV-visible spectrophotometer to form a gel-like substance. When the transmittance comes in the preferred range described above, addition of the poor solvent is stopped.

Comparison of the amount of a poor solvent added when the transmittance comes in the preferred range can be employed as a simplified method for evaluating development characteristics of a resist composition containing the resist copolymer.

According to a similar principle, development characteristics and lithographic characteristics can be evaluated with a deposition point (clouding point) of a copolymer. That is, to a test solution of a resist copolymer is gradually added a poor solvent until deposition of the copolymer is visually observed. An amount of a poor solvent (% by mass) added until the copolymer deposits also correlates with uniformity of the copolymer, and thus can be used for evaluating development characteristics and lithographic characteristics.

As used herein, the term "good solvent" refers to a solvent that can completely dissolve a resist copolymer in a not more than fivefold amount by mass of the copolymer. In the present invention, a particularly good solvent preferably completely dissolves a copolymer in a not more than threefold amount by mass of the copolymer. As used herein, the term "completely dissolve" refers to a solution that has a transmittance of 100% as measured as described above. Good solvents may be used alone or in combination in a test solution. In cases of a mixture of solvents, a solvent satisfying the conditions for a good solvent after being mixed can be used as the good solvent.

As used herein, the term "poor solvent" refers to a solvent that dissolves absolutely no resist copolymer in a fivefold amount by mass of the copolymer even with stirring at an ambient temperature (25° C.) when used alone. In the present invention, a particularly poor solvent preferably dissolves absolutely no resist copolymer in a tenfold amount by mass of the copolymer when used alone. In cases of a mixture of solvents, a solvent satisfying the conditions for a poor solvent after being mixed can be used as the poor solvent.

The good solvent can be appropriately selected from known resist solvents used in preparing a resist composition. These solvents may be used alone or in combination.

Specific examples of the preferred good solvent include tetrahydrofuran, 1,4-dioxane, acetone, methylethylketone, methylisobutylketone, propylene glycol monomethyl ether, propylene glycol monomethyl ether acetate, methyl lactate, ethyl lactate, butyl lactate, and γ-butyrolactone.

Examples of the poor solvent include pentane, hexane, heptane, octane, cyclohexane, methylcyclohexane, benzene, toluene, xylene, diethyl ether, diisopropyl ether, methanol, ethanol, isopropanol, and water. These solvents may be used alone or in combination.

Particularly when the resist copolymer to be evaluated is an acrylate copolymer, PGMEA (propylene glycol monomethyl ether acetate) and ethyl lactate are used as the good solvent. In the same case, IPE (diisopropyl ether), hexane, heptane, and methanol are preferably used as the poor solvent.

The content of a resist copolymer in a test solution can be appropriately set within the range that can provide a gel-like substance in the preferred amount as described above. In order to efficiently form a gel-like substance in an amount required for evaluation, the content is preferably not less than 1% by mass, and more preferably not less than 2% by mass. From the viewpoint of operability in separation, the content is preferably not more than 30% by mass, and more preferably not more than 20% by mass. When the content of a resist copolymer in a test solution is within this range, a gel-like substance can be efficiently formed in an amount required for evaluation, and the test solution has an adequate viscosity to contribute to good operability in separation after the gel-like substance is formed.

<Step (ii)>

Next, the gel-like substance in the test solution is separated. Any method can be used for separating the gel-like substance. However, filtration with a common filter is difficult to efficiently separate the gel-like substance. The gel-like substance is thus preferably separated by centrifugation.

A relative centrifugal acceleration in centrifugation (centrifugal force) is preferably not less than 100,000 G, more preferably not less than 300000 G, and even more preferably not less than 500,000 G. The relative centrifugal acceleration (centrifugal force) is represented by the equation (1):

$$\text{Relative centrifugal force } (G) = 1118 * r * N^2 * 10^{-8} \qquad (1)$$

wherein, r represents a radius of rotation (cm); and N represents a rotation number per minute (rpm).

The treatment temperature in centrifugation is preferably 0 to 40° C., more preferably 2 to 20° C., and even more preferably 4 to 10° C. At a treatment temperature within this range, a solvent is prevented from volatilization and the test solution can keep an adequate viscosity for separation. The treatment time can be appropriately set to enable to separate the gel-like substance according to a centrifugal force and the like. For example, the treatment time is preferably within the range from 0.1 to 10.0 hours, and more preferably from 1 to 4 hours. A treatment time within this range can provide a gel-like substance in an amount required to be evaluated.

In comparative evaluation of several copolymers for a resist, respective gel-like substances are separated under the same conditions.

<Step (iii)>

[Rate of Change of Composition Ratio]

When a resist copolymer comprises at least one constitutional unit having an acid-removable group and at least one constitutional unit having a polar group, the copolymer can be preferably evaluated with a rate of change of a composition rate as well as with the rate of change of molecular weight.

In this case, a gel-like substance separated from a test solution is dried preferably in vacuum, and measured for composition ratio of constitutional units to determine a rate of change of a composition ratio as described below.

The composition ratio of constitutional units of a resist copolymer before preparing a test solution is also measured beforehand.

The composition ratio of constitutional units of a resist copolymer and of a gel-like substance is measured by the same method, preferably by $^1$H-nuclear magnetic resonance (NMR) spectrometry.

A composition ratio of constitutional units refers to a percentage of the constitutional unit derived from a monomer (mol %) in the whole constitutional units constructing a resist copolymer (or gel-like substance). A composition rate of change is determined by subtracting a composition ratio of the constitutional units in the copolymer for lithography from a composition ratio of the constitutional units in the gel-like substance and dividing by the composition ratio of the constitutional units in the copolymer for lithography. In comparative evaluation of several copolymers for a resist, each composition rate of change is determined by the same method.

For example, when a resist copolymer is a three-component copolymer composed of two constitutional units each having a polar group (constitutional units a and b) and a constitutional unit having an acid-removable group (constitutional unit c), a rate of change of a composition ratio of the constitutional unit a is determined according to the equation (2):

$$\text{Rate of change of composition ratio of constitutional unit } a\ (\%) = (a2-a1)/a1 * 100 \qquad (2)$$

wherein, a1 represents a percentage (mol %) of the constitutional unit a in the whole constitutional units of the resist copolymer; and a2 represents a percentage (mol %) of the constitutional unit a in the whole constitutional units of a gel-like substance.

According to the method of evaluation of the present invention, sensitivity is evaluated with a positive rate of change of a composition ratio selected from the rate of change of the composition ratio constitutional units a to c. This means that the sensitivity is evaluated with a rate of change of a composition ratio of a constitutional unit of which a composition ratio in the resist copolymer is larger than that in the gel-like substance. In order to evaluate more accurately, it is the better use a rate of change of a composition ratio of a constitutional unit having the higher positive value.

The present inventors have found that a rate of change of a composition ratio of a constitutional unit having a polar group is larger than that of a constitutional unit having an acid-removable group. A polar group having a higher polarity generally results in a larger rate of change of the composition ratio. In many cases, a constitutional unit having an acid-removable group has a negative rate of change of a composition ratio. In the method of evaluation of the present invention, therefore, it is only necessary to determine at least a rate of change of a composition ratio of a constitutional unit having a polar group. When a copolymer comprises two or more constitutional units having a polar group, sensitivity of the copolymer is evaluated with a larger rate of change of a composition ratio of a constitutional unit.

The smaller composition rate of change calculated according to equation (2) corresponds to higher uniformity of the composition ratio of the constitutional unit in the whole copolymer. The copolymer thus achieves characteristics closer to those designed molecularly.

The rate of change of the composition ratio is preferably not more than 8%, more preferably not more than 6%, and even more preferably not more than 5%.

[Rate of Change of Molecular Weight]

A gel-like substance separated from a test solution is preferably dried in a vacuum and measured for polymerization average molecular weight to determine a rate of change of molecular weight as described below. The rate is used for evaluation.

A polymerization average molecular weight of a resist copolymer before preparing a test solution is also measured beforehand.

Weight average molecular weights of a resist copolymer (Mw1) and of a gel-like substance (Mw2) are measured by the same method. In the preferred method, a weight average molecular weight is measured by gel permeation chromatography with a polystyrene standard having a known molecular weight.

In comparative evaluation of several copolymers for a resist, respective weight average molecular weights are measured by the same method.

Resultant values Mw1 of the resist copolymer and Mw2 of the gel-like substance are used to calculate a rate of change of molecular weight (in %) according to the equation (3). The rate of change of molecular weight refers to a percentage calculated by subtracting Mw1 of the resist copolymer from Mw2 of the gel-like substance and dividing by Mw1 of the resist copolymer. The present inventors have found that always Mw2>Mw1.

$$\text{Rate of molecular weight change (\%)} = (Mw2 - Mw1)/Mw1 * 100 \quad (3)$$

The smaller rate of change of molecular weight calculated according to the equation (3) corresponds to the higher uniformity of the molecular weight of the whole copolymer. The copolymer thus has characteristics closer to characteristics as designed molecularly to be achieved.

The rate of change of molecular weight is varied according to an average molecular weight of a copolymer to be evaluated, a distribution of molecular weight, and an amount of gel-like substance separated, and the like. The value is preferably not more than 120%, more preferably not more than 100%, and even more preferably not more than 85%.

<Step (iv)>

Both the rate of change of the composition ratio and the rate of change of molecular weight in the present invention correlate with sensitivity of a resist composition comprising the resist copolymer as shown in Examples below. That is, the smaller rate of change of a composition ratio means the better sensitivity, and the smaller rate of change of molecular weight also means the better sensitivity. Therefore, sensitivity can be evaluated with at least one of these rates.

The term "good sensitivity" means that a resist composition has good alkali solubility after exposure. The resist composition having good sensitivity is thought to also exhibit few development defects and small variations in pattern dimension (LER). The method for evaluation of the present invention thus can be used for evaluating development characteristics such as development defects and variations in pattern dimension (LER) as well as sensitivity.

As described in Examples below, a gel-like substance generated in a test solution is a component having low solubility of a copolymer. The gel-like substance is also a component having a relatively high-molecular-weight weight and a composition of constitutional units deviating from a designed composition at a relatively large degree. The gel-like substance is thus thought to be a component increasing ununiformity of the copolymer. The gel-like substance may be derived from a high-molecular-weight product mainly generated at the early stage of polymerization or a high-molecular-weight product having a heterogeneous composition.

In the present invention, the smaller rate of change of a composition ratio or rate of change of molecular weight means the higher uniformity of a copolymer. A copolymer having high uniformity is thought to have good development characteristics such as sensitivity.

Therefore, the method for evaluation of the present invention can evaluate not only development characteristics of a composition for a resist but also lithographic characteristics varied depending on uniformity of a copolymer for lithography. That is, the copolymer having the smaller rate of change of a composition ratio or rate of change of molecular weight can achieve closer lithographic characteristics to those as designed molecularly.

A copolymer for lithography having a small rate of change of molecular weight according to the method for evaluation of the present invention and a lithography composition comprising the copolymer have high uniformity in molecular weight through the whole copolymer. The high uniformity in molecular weight of copolymer preferably improves lithographic characteristics. The smaller rate of molecular weight change provides closer lithographic characteristics to characteristics as designed molecularly to be achieved.

For example, as described in Examples below, a resist copolymer having not more than 120% of rate of change of molecular weight and a resist composition comprising the copolymer has satisfactory sensitivity in a developing process.

A copolymer for lithography having a small composition rate of change according to the method for evaluation of the present invention and a lithography composition comprising the copolymer have high uniformity in composition ratio of constitutional units through the whole copolymer. The high uniformity in composition ratio of constitutional units preferably improves lithographic characteristics. The smaller rate of change of a composition ratio provides closer lithographic characteristics to characteristics as designed molecularly to be achieved.

For example, as described in Examples below, a resist copolymer having not more than 8% of the rate of change of the composition ratio and a resist composition comprising the copolymer has satisfactory sensitivity in a developing process.

Examples

Hereinafter, the present invention will be described in more detail with reference to Examples, but should not be limited thereto.

Copolymers A-1 to 4, B-1 to 2, and C-1 to 2 were prepared with components shown in Tables 1, 2, and 3, according to the procedure described below.

Solvents and polymerization initiators used for preparing copolymers are as follows.

Solvent (S)
  S-1: ethyl lactate
  S-2: PGME (propylene glycol monomethyl ether)
  S-3: methanol
  S-4: water Polymerization Initiator (R)
  R-1: dimethyl-2,2'-azobisisobutyrate (Wako Pure Chemical Industries, Ltd., V-601 (product name))
  R-2: 2,2'-azobisisobutyronitrile Monomers (M-1) to (M-6) used for preparing copolymers are as follows.

[formula 1]

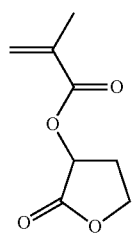

(M-1)

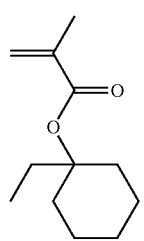

(M-2)

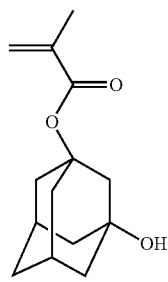

(M-3)

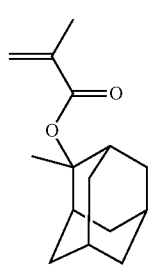

(M-4)

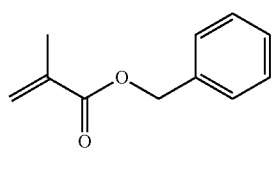

(M-5)

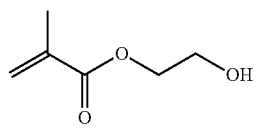

(M-6)

TABLE 1

| | Step 1 | | | | Step 2 | | | | | Step 3 | | Step 4 | | Step 5 | |
|---|---|---|---|---|---|---|---|---|---|---|---|---|---|---|---|
| | S-1 | M-1 | M-2 | M-3 | S-1 | M-1 | M-2 | M-3 | R-1 | S-1 | R-1 | S-3 | S-4 | S-3 | S-4 |
| Copolymer A-1 | 72.6 | — | — | — | 130.7 | 30.6 | 35.3 | 21.2 | 2.6 | — | — | 80 | 20 | 85 | 15 |
| Copolymer A-2 | 72.6 | — | — | — | 127 | 30.6 | 35.3 | 21.2 | 1.2 | 3.7 | 1.2 | 80 | 20 | 85 | 15 |
| Copolymer A-3 | 88.8 | 3.1 | 5.5 | 2.3 | 112.5 | 26.8 | 30.9 | 18.6 | 1.9 | 1.8 | 0.7 | 80 | 20 | 85 | 15 |
| Copolymer A-4 | 88.8 | 3.1 | 5.5 | 2.3 | 110.3 | 26.8 | 30.9 | 18.6 | 0.7 | 4 | 1.4 | 80 | 20 | 85 | 15 |

TABLE 2

| | Step 1 | | | | Step 2 | | | | | Step 3 | | Step 4 | | Step 5 | |
|---|---|---|---|---|---|---|---|---|---|---|---|---|---|---|---|
| | S-1 | M-1 | M-4 | M-3 | S-1 | M-1 | M-4 | M-3 | R-1 | S-1 | R-1 | S-3 | S-4 | S-3 | S-4 |
| Copolymer B-1 | 76.7 | — | — | — | 138.1 | 35.6 | 37.6 | 18.9 | 2.8 | — | — | 80 | 20 | 90 | 10 |
| Copolymer B-2 | 93.9 | 3.4 | 6.1 | 2.0 | 116.5 | 31.1 | 32.9 | 16.5 | 0.6 | 4.3 | 1.4 | 80 | 20 | 90 | 10 |

TABLE 3

|  | Step 1 | | | | Step 2 | | | | | Step 3 | |
| --- | --- | --- | --- | --- | --- | --- | --- | --- | --- | --- | --- |
|  | S-2 | M-1 | M-5 | M-6 | S-2 | M-1 | M-5 | M-6 | R-2 | S-2 | R-2 |
| Copolymer C-1 | 56.5 | — | — | — | 101.7 | 18.7 | 18.7 | 30.5 | 3.7 | — | — |
| Copolymer C-2 | 56.5 | 1.8 | 2.5 | 3.3 | 101.7 | 18.7 | 18.7 | 30.5 | 3.5 | 17.7 | 0.9 |

Preparation of Copolymers A and B

Respective copolymers were prepared in the same way.

(Step 1)

In a flask equipped with a nitrogen inlet, a stirrer, a condenser, two dropping funnels, and a thermometer, under nitrogen atmosphere, a mixed solution of components at a blend ratio shown in column Step 1 in Table 1 or 2 was stirred and heated with a water bath to 80° C. The blend ratio collectively represents a composition predetermined from a target composition ratio of a copolymer to be produced by taking into account respective reactivities of monomers used in polymerization. In a reactor containing monomers at the blend ratio, a polymer molecule generated immediately after dropping a mixed solution described in Step 2 below has a content ratio of constitutional units close to the target composition ratio.

(Step 2)

Into the flask, a mixed solution of components at a blend ratio shown in column Step 2 in Table 1 or 2 was added dropwise over 4 hours at a constant rate through a dropping funnel. The flask was hold at 80° C. for additional 3 hours.

(Step 3)

At the start of dropping the mixed solution in step 2, a mixed solution of components at a blend ratio shown in column Step 3 in Table 1 or 2 also started to be added dropwise into the flask through the other dropping funnel over 0.1 hours. A copolymer generated at the early stage of polymerization varies its weight average molecular weight according to amount of a polymerization initiator added dropwise in this step. The blend ratio of the polymerization initiator was set such that the weight average molecular weight was close to the desired value of a copolymer to be produced.

(Step 4)

A mixture of solvents at a blend ratio shown in column Step 4 in Table 1 or 2 was prepared in seven times the amount of the resultant reaction mixture. The reaction mixture was added dropwise into the stirred mixture to precipitate a white gel-like substance. The gel-like substance was filtered.

(Step 5)

A mixture of solvents at a blend ratio shown in column Step 5 in Table 1 or 2 was prepared in the same amount of the mixture in Step 4. The filtered gel-like substance was added in the mixture and collected by filtration. The collected product was dried for about 40 hours at 60° C. under reduced pressure to give a copolymer in a powder form.

Preparation of Copolymer C

Respective copolymers were prepared in the same way.

(Step 1)

In a flask equipped with a nitrogen inlet, a stirrer, a condenser, two dropping funnels, and a thermometer, under nitrogen atmosphere, a mixed solution of components at a blend ratio shown in column Step 1 in Table 3 was stirred and heated with a water bath to 80° C. The blend ratio collectively represents a composition predetermined from a desired composition of a copolymer to be produced by taking into account respective reactivities of monomers used in polymerization. In a reactor containing monomers at the blend ratio, a polymer molecule generated immediately after dropping a mixed solution described in Step 2 below has a content ratio of constitutional units close to the target composition ratio.

(Step 2)

A mixed solution of components at a blend ratio shown in column Step 2 in Table 3 was added dropwise to the flask over 6 hours at a constant rate through a dropping funnel. The flask was hold at 80° C. for 1 hour.

(Step 3)

At the start of dropping the mixed solution in step 2, a mixed solution of components at a blend ratio shown in column Step 3 in Table 3 also started to be added dropwise into the flask through the other dropping funnel over 0.5 hours. A copolymer generated at the early stage of polymerization varies its weight average molecular weight according to amount of a polymerization initiator added dropwise in this step. The blend ratio of the polymerization initiator was set such that the weight average molecular weight was close to the target value of a copolymer to be produced.

(Step 4)

IPE (diisopropyl ether) was prepared in seven times the amount of the resultant reaction mixture. The reaction mixture was added dropwise to stirred IPE to precipitate a white gel-like substance. The gel-like substance was filtered.

(Step 5)

IPE (diisopropyl ether) was prepared in the same amount of IPE in Step 4. The filtered gel-like substance was added to this mixture solvent and collected by filtration. The collected product was dried for about 40 hours at 60° C. under reduced pressure to give a copolymer in a powder form.

(Weight Average Molecular Weight of Copolymer for Lithography)

Each of copolymers A-1 to 4, B-1 to 2, and C-1 to 2 was measured for weight average molecular weight (Mw) and distribution of molecular weight (Mw/Mn) according to the following method.

A sample in an amount of about 20 mg was dissolved in 5 mL of THF and filtered through a 0.5 μm membrane filter to give a test solution. The test solution was used to measure a weight average molecular weight (Mw) and a number average molecular weight (Mn) with a gel permeation chromatography (GPC) apparatus (Tosoh Corporation, HCL-8220 (product name)) and determine a distribution of molecular weight (Mw/Mn). In the measurement, three tandemly-arrayed columns (Showa Denko K.K., ShodexGPCLF-804L (product name)) were used as separation columns. A solvent was THF (tetrahydrofuran). A flow rate was 1.0 mL/min. A detector was a differential refractometer. A measurement temperature was 40° C. An amount of injection was 0.1 mL. Polystyrene was used as a standard polymer. Results of the measurement are shown in Tables 7, 8, and 9.

(Composition Ratio of Constitutional Units in Copolymer for Lithography)

Each composition ratio (in mol %) of constitutional units in a copolymer for lithography was determined by measuring by $^1$H-NMR.

In the measurement, a superconducting FT-NMR apparatus (JEOL Ltd., model JNM-GX270) was used. A solution of about 5% by mass sample (in deuterated dimethylsulfoxide) was put in a sample tube having a diameter of 5 mm. A spectrum was measured for $^1$H with 64 times of integration at a measurement frequency of 270 Hz in a single parse mode. A measurement temperature was 60° C. Results of the measurement are shown in Tables 7, 8, and 9.

<Step (v)>

(Preparation of Test Solution)

Copolymers A-1 to 4, B-1 to 2, and C-1 to 2 each were dissolved in PGMEA (propylene glycol monomethyl ether acetate) such that a concentration of copolymer was 2.5% by mass to give copolymer solutions A-1 to 4, B-1 to 2, and C-1 to 2, respectively. Each solution was set to an ambient temperature (25° C.).

<Step (vi)>

A UV-visible spectrometer used was UV-3100PC (product name) from Shimadzu Corporation. A solution for measurement was put in a quarts square cell having an optical path length of 10 mm. Transmittances of copolymer solutions and a solvent with no copolymer (PGMEA) were measured according to a method for measuring a transmittance at 450 nm. Copolymer solutions A-1 to 4, B-1 to 2, and C-1 to 2 each had a transmittance of 100%. Each solution was confirmed to dissolve a copolymer completely.

Next, test solutions A-1 to 4, B-1 to 2, and C-1 to 2 were prepared from respective copolymer solutions A-1 to 4, B-1 to 2, and C-1 to 2 by gradually adding respective poor solvents shown in Tables 4 to 6, with monitoring respective transmittances of copolymer solutions at 450 nm according to the method for measuring a transmittance at 450 nm, until respective transmittances came in the range of 85±3%. Amounts of poor solvents added to respective 100 parts by mass of copolymer solutions A-1 to 4, B-1 to 2, and C-1 to 2 and transmittances of the test solutions A-1 to 4, B-1 to 2, and C-1 to 2 at 450 nm are shown in Table 4, 5, and 6.

TABLE 4

| | | Poor solvent | Amount added (parts by mass) | Transmittance (%) | Product |
|---|---|---|---|---|---|
| Reference Example 1 | Test solution A-1-H | n-heptane | 16.3 | 84 | Gel-like substance A-1-H |
| | Test solution A-1-I | diisopropyl ether | 23.7 | 85 | Gel-like substance A-1-I |
| Example 1 | Test solution A-2-I | diisopropyl ether | 31.2 | 86 | Gel-like substance A-2-I |
| Example 2 | Test solution A-3-I | diisopropyl ether | 32.6 | 85 | Gel-like substance A-3-I |
| Example 3 | Test solution A-4-H | n-heptane | 24.4 | 84 | Gel-like substance A-4-H |
| | Test solution A-4-I | diisopropyl ether | 33.2 | 86 | Gel-like substance A-4-I |

TABLE 5

| | | Poor solvent | Amount added (parts by mass) | Transmittance (%) | Product |
|---|---|---|---|---|---|
| Reference Example 2 | Test solution B-1-H | n-heptane | 10.7 | 85 | Gel-like substance B-1-H |
| | Test solution B-1-I | diisopropyl ether | 13.2 | 84 | Gel-like substance B-1-I |
| Example 4 | Test solution B-2-H | n-heptane | 14.8 | 85 | Gel-like substance B-2-H |
| | Test solution B-2-I | diisopropyl ether | 19.9 | 84 | Gel-like substance B-2-I |

TABLE 6

| | | Poor solvent | Amount added (parts by mass) | Transmittance (%) | Product |
|---|---|---|---|---|---|
| Reference Example 3 | Test solution C-1-I | diisopropyl ether | 16.6 | 84 | Gel-like substance C-1-I |
| Example 5 | Test solution C-2-I | diisopropyl ether | 20.1 | 86 | Gel-like substance C-2-I |

<Step (vii)>

(Centrifugal Separation)

Test solutions A-1 to 4, B-1 to 2, and C-1 to 2 were centrifuged to give respective gel-like substances A-1 to 4, B-1 to 2, and C-1 to 2. A process of centrifugal separation comprised a centrifugal treatment with a centrifugal machine Optima MAX-XP (product name) from Beckman Coulter Inc. Conditions for centrifugation were a relative centrifugal force of 500000 G, a centrifugation temperature of 4° C., and a centrifugation time of 4 hours. A relative centrifugal force is represented by the equation (1). The process further comprised collecting respective solid matters resulting from the centrifugation and drying 8 hours at 60° C. to give respective gel-like substances A-1 to 4, B-1 to 2, and C-1 to 2.

(Weight Average Molecular Weight and Composition Ratio of Constitutional Unit of Gel-Like Substance)

Each of gel-like substances A-1 to 4, B-1 to 2, and C-1 to 2 was measured for Mw and Mw/Mn by the same method as for a resist copolymer. The composition ratio of constitutional units of each of the gel-like substances was measured for Mw and Mw/Mn by the same method as for a copolymer for lithography. Results of measurements are shown in Tables 7, 8, and 9.

<Step (viii)>

(Rate of Change of Composition Ratio)

From the composition ratio of copolymers for lithography and corresponding gel-like substances, for respective copolymers, the rate of change of the composition ratio (in %) of a constitutional unit derived from α-GBLMA among three constitutional units were determined by the equation (2). The constitutional unit derived from α-GBLMA has a polar group. The composition ratio of the constitutional units derived from α-GBLMA was relatively largely different between a copolymer for lithography and a corresponding gel-like substance. Results are shown in Tables 7, 8, and 9.

Rate of change of composition ratio of constitutional
unit $a$ (%)=$(a2-a1)/a1*100$     (2)

a1: percentage of a constitutional unit a in the whole constitutional units of a resist copolymer (mol %)

a2: percentage of a constitutional unit a in the whole constitutional units of a corresponding gel-like substance (mol %)

Values of a1 and a2 were determined by the $^1$H-NMR measurement under the measurement conditions described above.

[Evaluation of Sensitivity]

Copolymers for lithography A-1 to 4 and B-1 to 2 were used to prepare respective resist compositions for lithography. These compositions were used in dry lithography and evaluated for sensitivity according to the following method.

(Preparation of Resist Composition)

Components shown below were mixed to give a resist composition.

Resist copolymer: 10 parts
Photoacid generator (Midori Kagaku Co. Ltd., product name: TPS-105, triphenylsulfonium triflate): 0.2 parts
Leveling agent (Nippon Unicar Co. Ltd., product name: L-7001): 0.2 parts
Solvent (PGMEA): 90 parts (Dry Lithography)

The resist composition prepared was applied on a 6-inch silicon wafer by rotation and pre-baked (PB) for 60 seconds at 120° C. on a hotplate to give a film having a thickness of 300 nm. The film was exposed with 18 shots of a laser beam from an ArF eximer laser exposure system (Litho Tech Japan Corporation, trade name: VUVES-4500) at various light quantities. A shot fully exposes a rectangular region of 10 mm by 10 mm. The film was then post-baked (PEB) for 60 seconds at 110° C. The film was developed with an aqueous solution of 2.38% tetramethylammonium hydroxide for 65 seconds at 23.5° C. in a resist development analyzer (Litho Tech Japan Corporation, trade name: RDA-790). During developing, change in thickness of the resist film was observed over time. For each light quantity, a ratio of a thickness of a remaining film after 60 seconds of development to an initial thickness of the film (hereinafter, referred to as remaining film rate, in %) was determined.

Resultant data were used to plot a curve of the remaining film rate (%) against logarithm of light quantity (mJ/cm$^2$) (hereinafter, referred to as light quantity-remaining film rate curve). A light quantity (mJ/cm$^2$) at the cross-point of the light quantity-remaining film rate curve and the straight line of 0% remaining film rate (hereinafter, referred to as Eth) was then determined. The term "Eth" refers to a light quantity necessary for exposing to 0% remaining film rate. Eth represents sensitivity. The smaller Eth means the higher sensitivity. Results are shown in Tables 7 and 8.

[Evaluation of Solubility]

Copolymers for lithography C-1 to 2 were used to prepare respective solutions for evaluating solubility. Solutions were set to an ambient temperature (25° C.). A UV-visible spectrometer used was UV-3100PC (product name) from Shimadzu Corporation. A solution for measurement was put in a quarts square cell having an optical path length of 10 mm. Solubility was evaluated according to a method for measuring a transmittance at 450 nm. The higher transmittance means better solubility. A lithographic composition having good solubility can be applied on a substrate with reduced non-uniformity in lithographic performances in a plane. Results are shown in Table 9.

(Preparation of Solution for Evaluating Solubility)

Components shown below were mixed to give a solution for evaluation.

Copolymer for lithography: 2.5 parts,
Solvent 1 (PGME): 100 parts,
Solvent 2 (IPE): 16 parts

TABLE 7

| | | Mw | Mw/Mn | Rate of change of molecular weight (%) | Composition ratio (mol %) α-GBLMA | Composition ratio (mol %) ECHMA | Composition ratio (mol %) HAdMA | Rate of change of composition ratio of α-GBLMA (%) | Evaluation of Sensitivity Eth (mJ/cm$^2$) |
|---|---|---|---|---|---|---|---|---|---|
| Reference | Copolymer A-1 | 10500 | 1.78 | | 40.7 | 38.9 | 20.4 | | 1.065 |
| Example 1 | Gel-like substance A-1-H | 25500 | 1.98 | 142.9 | 44.9 | 33.9 | 21.1 | 10.3 | |
| | Gel like substance A-1-I | 24100 | 1.83 | 129.5 | 44.5 | 32.4 | 23.0 | 9.3 | |
| Example 1 | Copolymer A-2 | 10000 | 1.89 | | 40.3 | 38.7 | 21.0 | | 1.047 |
| | Gel-like substance A-2-I | 18900 | 1.89 | 89.0 | 43.5 | 34.7 | 21.9 | 7.9 | |
| Example 2 | Copolymer A-3 | 10400 | 1.86 | | 39.2 | 39.3 | 21.6 | | 0.909 |
| | Gel-like substance A-3-I | 19600 | 1.83 | 88.5 | 42.2 | 36.2 | 21.6 | 7.7 | |
| Example 3 | Copolymer A-4 | 9800 | 1.75 | | 40.1 | 40.7 | 19.2 | | 0.815 |
| | Gel like substance A-4-H | 20200 | 1.89 | 106.1 | 41.5 | 37.8 | 20.7 | 3.5 | |
| | Gel like substance A-4-I | 18300 | 1.79 | 86.7 | 42.1 | 35.8 | 22.1 | 5.0 | |

TABLE 8

| | | Mw | Mw/Mn | Rate of change of molecular weight (%) | Composition ratio (mol %) α-GBLMA | Composition ratio (mol %) MAdMA | Composition ratio (mol %) HAdMA | Rate of change of Composition ratio of α-GBLMA (%) | Evaluation of Sensitivity Eth (mJ/cm$^2$) |
|---|---|---|---|---|---|---|---|---|---|
| Reference Example 2 | Copolymer B-1 | 9500 | 1.67 | | 45.6 | 38.8 | 15.6 | | 3.023 |
| | Gel-like substance B-1-H | 24000 | 1.53 | 152.6 | 50.1 | 33.7 | 16.2 | 9.9 | |
| | Gel like substance B-1-I | 22600 | 1.63 | 137.9 | 49.9 | 35.0 | 15.0 | 9.4 | |

TABLE 8-continued

|  |  | Mw | Mw/Mn | Rate of change of molecular weight (%) | Composition ratio (mol %) | | | Rate of change of Composition ratio of α-GBLMA (%) | Evaluation of Sensitivity Eth (mJ/cm²) |
|---|---|---|---|---|---|---|---|---|---|
|  |  |  |  |  | α-GBLMA | MAdMA | HAdMA |  |  |
| Example 4 | Copolymer B-2 | 9000 | 1.58 |  | 45.5 | 38.9 | 15.6 |  | 2.523 |
|  | Gel-like substance B-2-H | 18800 | 1.48 | 108.9 | 47.7 | 37.4 | 14.9 | 4.8 |  |
|  | Gel-like substance B-2-I | 17400 | 1.47 | 93.3 | 46.6 | 38.6 | 14.8 | 2.4 |  |

TABLE 9

|  |  | Mw | Mw/Mn | Rate of change of molecular weight (%) | Composition ratio (mol %) | | | Rate of change of composition ratio of α-GBLMA (%) | Solubility Transmittance (%) |
|---|---|---|---|---|---|---|---|---|---|
|  |  |  |  |  | α-GBLMA | BZMA | HEMA |  |  |
| Reference | Copolymer C-1 | 9700 | 1.80 |  | 26.1 | 23.8 | 50.1 |  | 87 |
| Example 3 | Gel-like substance C-1-I | 25500 | 1.54 | 162.9 | 29.2 | 23.7 | 47.1 | 11.9 |  |
| Example 5 | Copolymer C-2 | 9500 | 1.73 |  | 26.1 | 23.8 | 50.1 |  | 99 |
|  | Gel-like substance C-2-I | 22700 | 1.55 | 138.9 | 27.6 | 24.5 | 47.8 | 5.7 |  |

As can be seen from the results in Tables 7 and 8, copolymers for lithography A-1 to 4 and B-1 to 2 each had a similar composition ratio of constitutional units each other, but a different rate of change of the composition ratio in descending order. A copolymer having the smaller rate of change of the composition ratio of α-GBLMA had the smaller Eth.

As can be seen from results in Table 9, copolymers for lithography C-1 to 2 had similar component rates of constitutional units each other, but a different rate of change of the composition ratio in descending order. A copolymer having the smaller rate of change of the composition ratio of α-GBLMA had the higher transmittance. The transmittance represents solubility.

As described above, a composition rate of change was confirmed to correlate with Eth and transmittance. That is, it was confirmed that lithographic performances could be evaluated based on a rate of change of a composition ratio.

INDUSTRIAL APPLICABILITY

According to the present invention, lithographic characteristics of a lithographic composition comprising a copolymer for lithography can be evaluated without actual preparation.

The invention claimed is:

1. A method for evaluating a copolymer, the method comprising:
   (i) dissolving a copolymer in a solvent to prepare a test solution comprising a gel substance;
   (ii) separating the gel substance from the test solution;
   (iii) determining a rate of change of a composition ratio, wherein the rate of change is a ratio of a difference obtained by subtracting a composition ratio of constitutional units of the copolymer from a composition ratio of constitutional units of the gel substance to the composition ratio of the constitutional units of the lithographic copolymer; and
   (iv) evaluating a lithographic characteristic of a lithographic composition comprising the copolymer based on the rate of change of the composition ratio.

2. The method of claim 1, wherein the copolymer is a resist copolymer comprising a constitutional unit having an acid-removable group and a constitutional unit having a polar group, and
   wherein a development characteristic of a resist composition comprising the resist copolymer is evaluated based on the rate of change of the composition ratio.

3. The method of claim 1, wherein, the dissolving (i) comprises adding a second solvent, to obtain the gel substance.

4. The method of claim 1, wherein the separating (ii) is carried out by centrifugation.

5. A copolymer, having a rate of change of a composition of not more than 6%, and a distribution of molecular weight (Mw/Mn) of 1.58 or more to 1.98 or less,
   wherein the rate of change of the composition is obtained by a process comprising:
   producing a polymer composed of constitutional units $\alpha'_1$ to $\alpha'_n$ by polymerizing two or more monomers $\alpha_1$ to $\alpha_n$ in a reactor with dropping monomers and a polymerization initiator into the reactor,
   wherein a first solution and a second solution that has different compositions are supplied into the reactor in the polymerization, wherein the first solution is placed in the reactor before the second solution, wherein the composition of the first solution is designed so that when the second solution is added dropwise to the reactor containing monomers at a content ratio equal to the first composition ratio, a polymer molecule generated immediately after dropping has a content ratio of constitutional units equal to a target composition ratio, and a content ratio of monomers in the second solution is nearly equal to a polymer composition to be produced;
   (v) dissolving a copolymer in propylene glycol monomethyl ether acetate, to prepare a test solution having a copolymer concentration of 2.5% by mass based on a total mass of the test solution;
   (vi) adding a second solvent to the test solution until the test solution has a transmittance at 450 nm is in a range of 85±3%;

(vii) separating the gel substance from the test solution by centrifugation with a relative centrifugal force of 500,000 G, a processing temperature of 4° C., and a processing time of 4 hours; and (viii) determining a rate of change of the composition by a nuclear magnetic resonance spectrometer, wherein the rate of change is a ratio of a difference obtained by subtracting a composition ratio of at least one of constitutional units in the copolymer from a composition ratio of at least one of constitutional units in the gel substance to the composition ratio of the constitutional units of the copolymer for lithography.

6. A lithographic composition, comprising the copolymer of claim 5.

7. A method for producing a copolymer, the method comprising:

(a) polymerizing monomers, to obtain a copolymer; and (b) evaluating the copolymer according to the method of claim 1.

8. The method of claim 1, not comprising preparing the lithographic composition.

9. The method of claim 1, wherein the copolymer is suitable for use in a lithographic composition.

10. The method of claim 1, wherein the solvent is at least one selected from the group consisting of tetrahydrofuran, 1,4-dioxane, acetone, methylethylketone, methylisobutylketone, propylene glycol monomethyl ether, propylene glycol monomethyl ether acetate, methyl lactate, ethyl lactate, butyl lactate, and γ-butyrolactone.

11. The method of claim 3, wherein the solvent is propylene glycol monomethyl ether acetate.

12. The method of claim 3, wherein the solvent is ethyl lactate.

13. The method of claim 3, wherein the second solvent is at least one selected from the group consisting of pentane, hexane, heptane, octane, cyclohexane, methylcyclohexane, benzene, toluene, xylene, diethyl ether, diisopropyl ether, methanol, ethanol, isopropanol, and water.

14. The method of claim 3, wherein the second solvent is diisopropyl ether.

15. The method of claim 3, wherein the second solvent is hexane.

16. The method of claim 3, wherein the second solvent is heptane.

17. The method of claim 3, wherein the second solvent is methanol.

18. The method of claim 5, wherein the second solvent is at least one selected from the group consisting of pentane, hexane, heptane, octane, cyclohexane, methylcyclohexane, benzene, toluene, xylene, diethyl ether, diisopropyl ether, methanol, ethanol, isopropanol, and water.

19. The method of claim 2, wherein a content of the resist copolymer in the test solution is not less than 1% by mass and not more than 30% by mass based on a total mass of the test solution.

20. The method of claim 2, wherein a content of the resist copolymer in the test solution is not less than 2% by mass and not more than 20% by mass based on a total mass of the test solution.

* * * * *